(12) United States Patent
Miyaki et al.

(10) Patent No.: US 6,777,262 B2
(45) Date of Patent: *Aug. 17, 2004

(54) METHOD OF PACKAGING A SEMICONDUCTOR DEVICE HAVING GULL-WING LEADS WITH THINNER END PORTIONS

(75) Inventors: Yoshinori Miyaki, Tachikawa (JP); Hiromichi Suzuki, Tokyo (JP)

(73) Assignee: Renesas Technology Corp., Tokyo (JP)

( * ) Notice: Subject to any disclaimer, the term of this patent is extended or adjusted under 35 U.S.C. 154(b) by 0 days.

This patent is subject to a terminal disclaimer.

(21) Appl. No.: 10/386,552

(22) Filed: Mar. 13, 2003

(65) Prior Publication Data

US 2003/0136573 A1 Jul. 24, 2003

Related U.S. Application Data

(63) Continuation of application No. 10/277,872, filed on Oct. 23, 2002, now Pat. No. 6,553,657, which is a continuation of application No. 10/190,575, filed on Jul. 9, 2002, now Pat. No. 6,541,702, which is a continuation of application No. 09/457,292, filed on Dec. 9, 1999, now Pat. No. 6,444,905.

(30) Foreign Application Priority Data

Dec. 24, 1998  (JP) ............................................ 10-366199

(51) Int. Cl.$^7$ ......................... H01L 21/44; H01L 21/48; H01L 21/50

(52) U.S. Cl. ...................... 438/106; 438/111; 438/112; 438/123; 438/124

(58) Field of Search ................................ 438/106, 112, 438/123, 124

(56) References Cited

U.S. PATENT DOCUMENTS

| 4,920,074 A | | 4/1990 | Shimizu et al. | |
|---|---|---|---|---|
| 5,094,982 A | * | 3/1992 | Suzuki et al. | ................. 29/827 |
| 5,386,625 A | | 2/1995 | Tsukamoto | |
| 5,444,293 A | | 8/1995 | Li | |
| 5,518,684 A | | 5/1996 | Pruitt | |
| 5,557,144 A | | 9/1996 | Rosenstock et al. | |
| 5,619,065 A | | 4/1997 | Kim | |
| 5,736,784 A | | 4/1998 | Dove | |
| 5,824,950 A | | 10/1998 | Mosley et al. | |
| 5,877,937 A | | 3/1999 | Shibata et al. | |
| 6,252,299 B1 | | 6/2001 | Masuda et al. | |
| 6,541,702 B2 | * | 4/2003 | Miyaki et al. | ............. 174/52.4 |

FOREIGN PATENT DOCUMENTS

| JP | 63-70548 | 3/1988 |
|---|---|---|
| JP | 1-309359 | 12/1989 |
| JP | 4-196573 | 7/1992 |
| JP | 6-188350 | 7/1994 |
| JP | 6-350003 | 12/1994 |

* cited by examiner

Primary Examiner—John F. Niebling
Assistant Examiner—Angel Roman
(74) Attorney, Agent, or Firm—Mattingly, Stanger & Malur, P.C.

(57) ABSTRACT

In order to suppress defective lead forming and defective mounting, a semiconductor device comprises a sealing body which has a square planar shape, a semiconductor chip which lies within the sealing body, and a plurality of leads which are electrically connected with electrodes of the semiconductor chip, which extend inside and outside the sealing body and which are arrayed along latera of the sealing body, wherein an outer lead portion of each of the leads is such that a root part which protrudes out of the sealing body is formed at a lead width being equal to or greater than a lead thickness, and that a mounting part which joins to the root part through an intermediate part is formed at a lead width being less than the lead thickness.

9 Claims, 7 Drawing Sheets

METHOD OF PACKAGING A SEMICONDUCTOR DEVICE HAVING GULL-WING LEADS WITH THINNER END PORTIONS

This is a continuation application of U.S. Ser. No. 10/277,872, filed Oct. 23, 2002 now U.S. Pat. No. 6,553,657, which is continuation application of U.S. Ser. No. 10/190,575, filed Jul. 9, 2002 now U.S. Pat. No. 6,541,702, which is a continuation application of U.S. Ser. No. 09/457,292 filed Dec. 9, 1999, now U.S. Pat. No. 6,444,905.

FIELD OF THE INVENTION

The present invention relates to a semiconductor device, and more particularly to techniques which are effective when applied to a semiconductor device having a plurality of leads that extend inside and outside a sealing body.

BACKGROUND OF THE INVENTION

A semiconductor device of QFP (Quad Flat Package) type, for example, has been known as one of semiconductor devices well suited for increasing the number of pins. In general, the semiconductor device of the QFP type is manufactured by an assembling process employing a lead frame. Concretely, it is manufactured in such a way that a semiconductor chip is mounted through an adhesive on the chip mounting surface of a die pad (also termed a "tab") which is supported on the frame member of the lead frame through supporting leads, that electrodes (also termed "bonding pads") formed on the circuit forming surface of the semiconductor chip and the inner lead portions (also termed the "inner leads") of leads (leads for connections) supported by the frame member of the lead frame are thereafter electrically connected by pieces of conductive wire, that the semiconductor chip, the die pad, the supporting leads, the inner lead portions of the connection leads, and the wire pieces are thereafter encapsulated with a sealing body which is made of an insulating resin, that tie bars (also termed "dam bars") which tie the adjacent ones of the connection leads are thereafter cut away, that the outer lead portions (also termed the "outer leads") of the connection leads are thereafter subjected to a plating treatment, that the outer lead portions of the connection leads are thereafter cut away from the frame member of the lead frame, that the outer lead portions of the connection leads are thereafter shaped into a gull-wing shape which is one of flat packaging (surface-mounted) lead shapes, and that the supporting leads are thereafter cut away from the frame member of the lead frame.

Each of the outer lead portions of the connection leads molded into the gull-wing shape is constructed having a root part which protrudes out of the sealing body, an intermediate part which bends downwards from the root part, and a mounting part which extends from the intermediate part in the same direction as the extending direction of the root part. Such mounting parts are employed as terminal parts for external connections in the case where the semiconductor device is soldered and mounted onto a mounting substrate.

Meanwhile, in the semiconductor device of the QFP type, the number of pins is increasing more and more as a circuit system to be included in the semiconductor chip becomes higher in the density of integration and larger in the number of functions. A lead array in the outer lead portions of the connection leads is set at a narrower pitch with the increase in the number of pins.

The narrower pitch of the outer lead portions is promoted by narrowing the interval between the adjacent connection leads and the width of each of the connection leads. Therefore, when the semiconductor device is soldered and mounted onto the mounting substrate, such defective mounting is liable to occur that a solder bridge appears across the mounting parts of a certain one of the outer lead portions and the outer lead portion adjoining the certain outer lead portion, to short-circuit the corresponding adjacent leads.

Besides, when the outer lead portions are molded into the gull-wing shape, such defective lead molding is liable to occur that the outer lead portions are molded into a state where they bend in the direction of arraying the connection leads (laterally of the outer lead portions), due to their insufficient mechanical strength. The defective lead molding forms a factor for incurring the short-circuit defect that the mounting part of a certain one of the outer lead portions comes into touch with the mounting part of the outer lead portion adjoining the certain outer lead portion, and also a factor for incurring the appearance of the solder bridge in the mounting operation.

As a technique for solving such problems ascribable to the narrowed pitch of the outer lead portions, by way of example, one wherein the lead width of the shoulder part (root part) of the outer lead of each connection lead is set broader than that of the base part (mounting part) thereof is disclosed in the official gazette of Japanese Patent Laid-open No. 350003/1994 (laid open on Dec. 22, 1994). According to this technique, the shoulder parts of the outer leads are endowed with sufficient rigidity. Therefore, even when mechanical stresses have acted on the shoulder parts in the forming operation, the connection leads do not deform into greatly discrepant geometries, so that a conduction defect ascribable to the touch between the connection leads adjoining each other, a conduction defect ascribable to the insufficient touch of the connection lead with an electrode, etc. can be prevented from occurring. Moreover, a pitch of predetermined dimension is ensured by narrowing the lead width of the base parts of the outer leads. Therefore, in a case where a semiconductor integrated circuit device is soldered to a printed circuit board, the solder bridge due to which the adjacent connection leads are electrically connected by a solder can be simultaneously prevented from appearing.

SUMMARY OF THE INVENTION

A point to be explained below, however, is not considered in the technique mentioned above.

The bend of the outer lead portions in the connection lead arraying direction in the forming operation is governed by the lead width of the root parts of the outer lead portions. In a case where the lead width of the root parts is equal to or greater than the lead thickness thereof, the mechanical strength of the root parts in the connection lead arraying direction is high, and hence, the bend of the outer lead portions in the connection lead arraying direction in the forming operation can be suppressed to some extent. However, in a case where the lead width of the root parts is less than the lead thickness thereof, the mechanical strength of the root parts in the connection lead arraying direction is low, and hence, the bend of the outer lead portions in the connection lead arraying direction in the forming operation becomes difficult of suppression. In other words, the lead thickness of the root parts needs to be considered in order that the defective lead forming of the outer lead portions may be suppressed by setting the lead width of the root parts broader than the lead width of the mounting parts.

An object of the present invention is to provide techniques which are capable of suppressing the defective lead forming and defective mounting of a semiconductor device.

The above and other objects and novel features of the present invention will become apparent from the description of this specification when read in conjunction with the accompanying drawings.

A typical aspect of performance of the present invention is briefly summarized as follows:

A semiconductor device comprises a sealing body which has a square planar shape, a semiconductor chip which lies within said sealing body, and a plurality of leads (leads for connections) which are electrically connected with electrodes of said semiconductor chip, which extend inside and outside said sealing body and which are arrayed along latera of said sealing body, wherein an outer lead portion of each of said leads is such that a root part which protrudes out of said sealing body is formed at a lead width being equal to or greater than a lead thickness, and that a mounting part which joins to said root part through an intermediate part is formed at a lead width being less than the lead thickness.

According to the above expedient, the root parts of the outer lead portions are formed at the lead width equal to or greater than the lead thickness, so that the mechanical strength of the root parts in the direction of arraying the leads becomes higher than in case of forming the root parts of the outer lead portions at a lead width less than the lead thickness. It is therefore possible to suppress the defective lead forming that, in a lead forming operation for the outer lead portions, these outer lead portions are shaped into a state where they bend in the lead arraying direction.

Besides, the mounting parts of the outer lead portions are formed at the lead width less than the lead thickness, so that the interval between the respectively adjacent leads at the mounting parts (becomes broader than in case of forming the mounting parts of the outer lead portions at a lead width equal to or greater than the lead thickness. It is therefore possible to suppress solder bridges which appear across the mounting parts of the adjacent leads in soldering and mounting the semiconductor device onto a mounting substrate, and to suppress the defective mounting that the adjacent leads short-circuit.

DESCRIPTION OF THE PREFERRED EMBODIMENTS

Now, the construction of the present invention will be described in conjunction with embodiments in which the present invention is applied to a semiconductor device of QFP type. Incidentally, throughout the drawings for describing the embodiments, the same symbols are assigned to parts having the same functions, which shall be omitted from repeated explanation.

Figure 1:
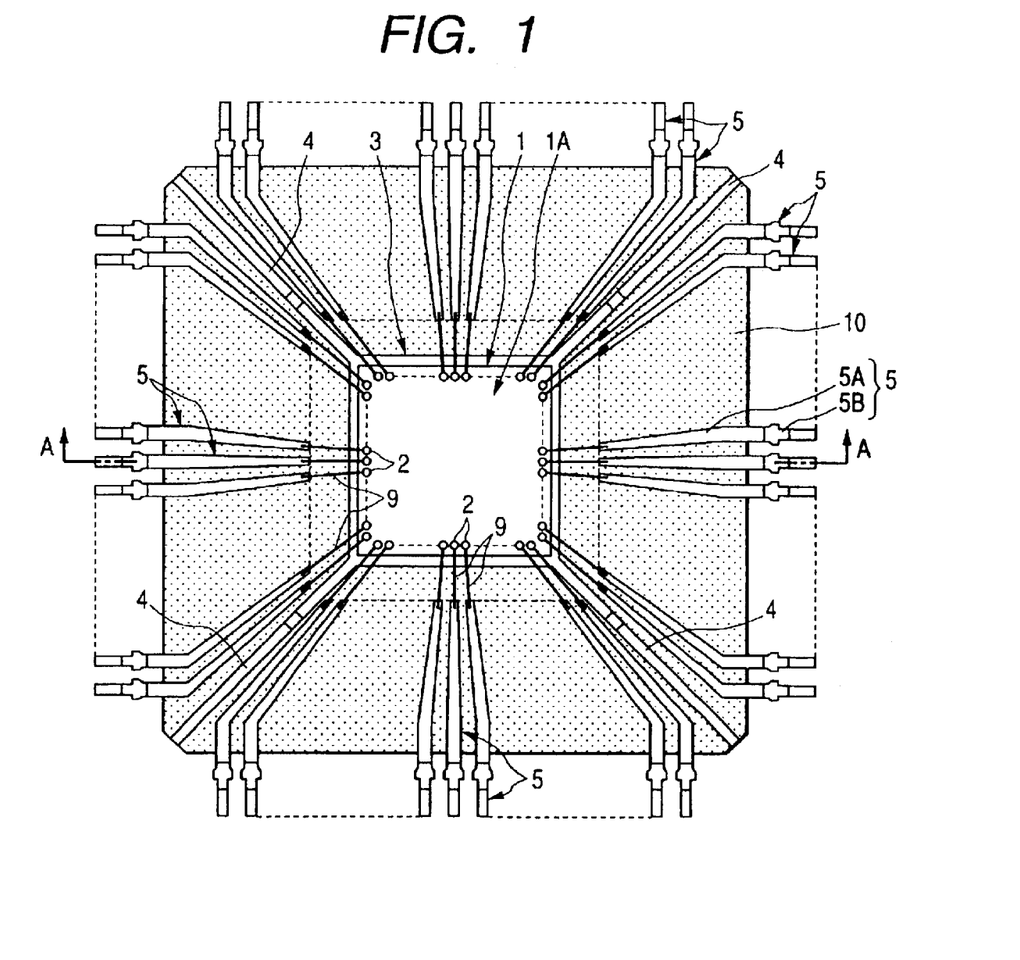
FIG. 1 is a schematic plan view of a semiconductor device being an embodiment of the present invention in a state where the upper part of a sealing body has been removed.
Figure 2:
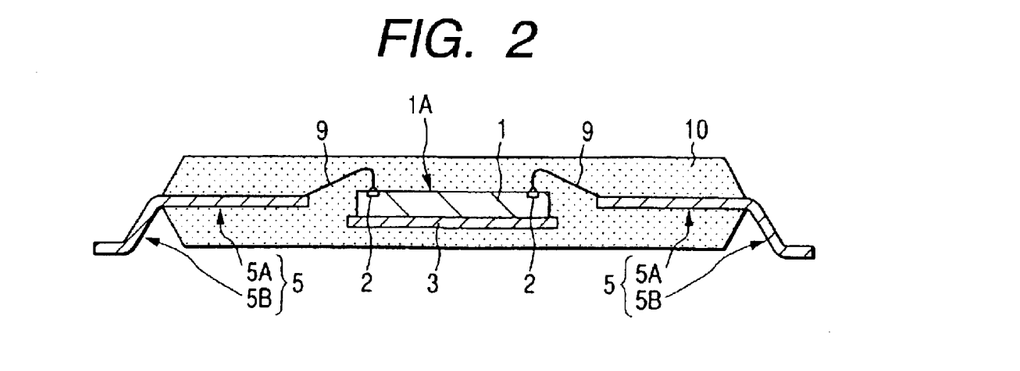
FIG. 2 is a schematic sectional view taken along line A—A indicated in FIG. 1.
Figure 3:
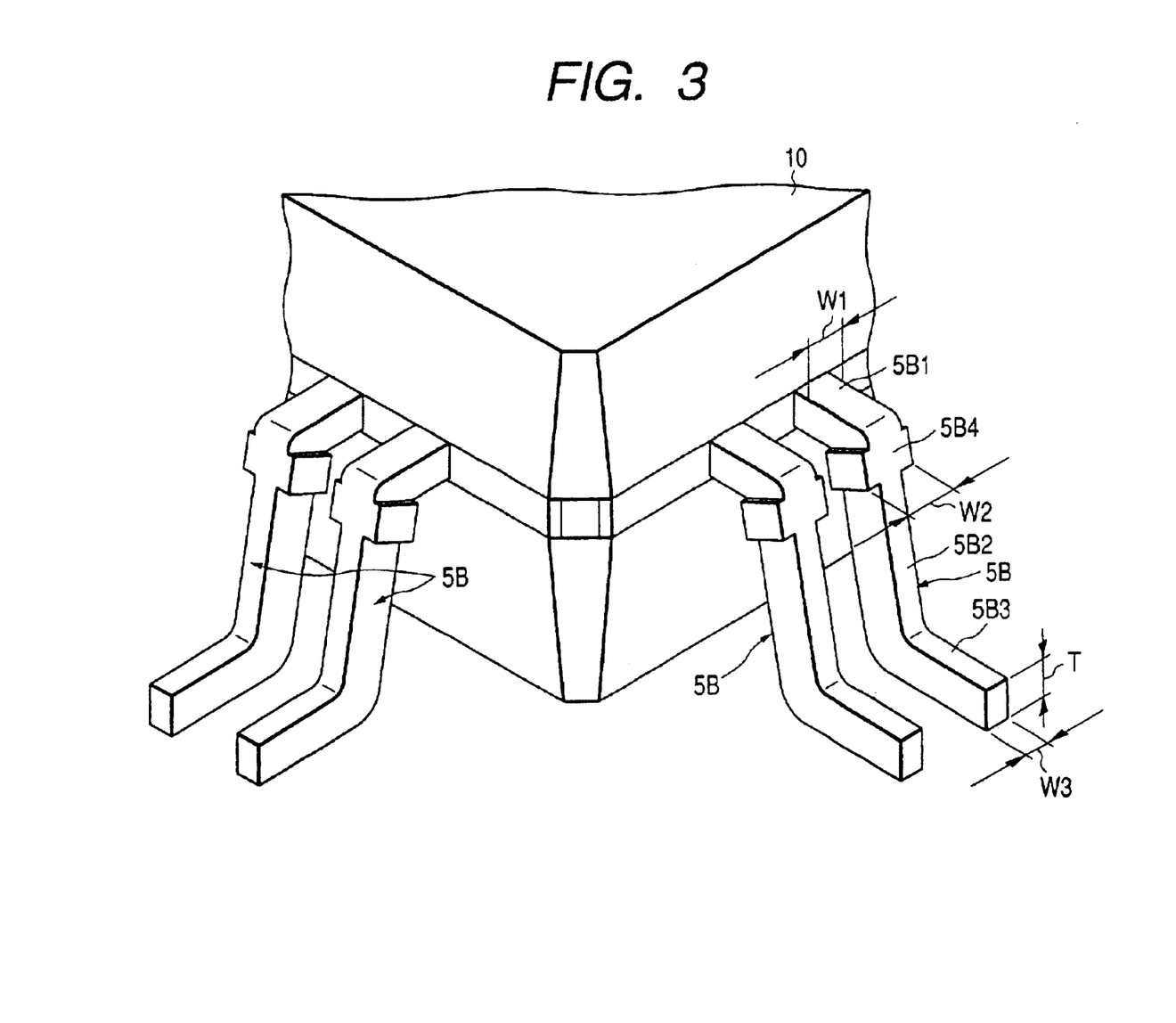
FIG. 3 is a schematic perspective view of the essential portions of the semiconductor device.

FIG. 1 is a schematic plan view of a semiconductor device being an embodiment of the present invention with the upper part of a sealing body removed therefrom, FIG. 2 is a schematic sectional view taken along line A—A indicated in FIG. 1, and FIG. 3 is a schematic perspective view of the essential portions of the semiconductor device.

As illustrated in FIGS. 1 and 2, the semiconductor device of this embodiment is constructed having a semiconductor chip 1, a die pad 3, four supporting leads 4, a plurality of leads for connections 5, a plurality of pieces of conductive wire 9, and the sealing body 10.

The semiconductor chip 1 lies within the sealing body 10, and is mounted through an adhesive on the chip mounting surface of the die pad 3 in a state where the circuit forming surface 1A of the front and rear surfaces of this semiconductor chip faces upwards. By way of example, the semiconductor chip 1 chiefly includes a semiconductor substrate which is made of single-crystal silicon, and insulating layers and wiring layers which are formed over the semiconductor substrate. The planar shape of the semiconductor chip 1 is a square shape, which is a regular square in this embodiment.

A logic circuit system, for example, is constructed as a circuit system in the semiconductor chip 1. The logic circuit system mainly includes transistor elements formed on the principal surface of the semiconductor substrate, and wiring lines formed in the wiring layers.

The circuit forming surface 1A of the semiconductor chip 1 is formed with a plurality of electrodes (bonding pads) 2 along the respective latera of the semiconductor chip 1 at the outer periphery thereof. The plurality of electrodes 2 are formed in the uppermost one of the wiring layers of the semiconductor chip 1, and they are electrically connected through the wiring lines to the transistor elements constituting the circuit system, respectively. Each of the plurality of electrodes 2 is formed of, for example, an aluminum (Al) film or an aluminum alloy film.

The die pad 3 lies within the sealing body 10. The planar shape of the die pad 3 is, for example, a square shape, and the external size thereof is somewhat larger than that of the semiconductor chip 1.

The planar shape of the sealing body 10 is a square shape, which is a regular square in this embodiment. In order to attain a lower stress, the sealing body 10 is formed of, for example, a biphenyl-based insulating resin which is doped with a phenolic hardener, silicone rubber, a filler, or the like. The sealing body 10 is formed by transfer molding technology which is well suited for mass production. The transfer molding technology is a process wherein, using a metal mold which includes a pot, a runner, a pouring gate and a cavity, an insulating resin is injected under pressure from the pot into the cavity through the runner as well as the pouring gate, thereby to form a sealing body.

The plurality of connection leads 5 extend inside and outside the sealing body 10, respectively. The individual connection leads 5 are such that their inner lead portions 5A lying within the sealing body 10 are arrayed along the respective latera of the semiconductor chip 1 at the outer periphery thereof, and that their outer lead portions 5B lying outside the sealing body 10 are arrayed along the respective latera of the sealing body 10 at the outer periphery thereof.

The plurality of connection leads 5 are electrically connected through the wire pieces 9 to the plurality of electrodes 2 formed on the circuit forming surface 1A of the semiconductor chip 1, respectively. Each of the wire pieces 9 has its one end side connected to the electrode 2 of the semiconductor chip 1, and has its other end side connected to the distal or front end part of the inner lead portion 5A. Gold (Au) wire, for example, is employed as the wire 9. By way of example, bonding in which ultrasonic vibrations are used conjointly with thermocompression is employed as a method of connecting the wire 9.

The four supporting leads 4 lie within the sealing body 10, and are arranged outside the outer periphery of the semiconductor chip 1. Each of the four supporting leads 4 is integral with the corresponding one of the four corners of the die pad 3, and extends toward the corresponding one of the four corners of the sealing body 10. Each of the four supporting leads 4 is subjected to a bending work for locating the die pad 3 at a level lower than that of the inner lead portions 5A of the connection leads 5.

The outer lead portions 5B of the respective connection leads 5 are shaped into, for example, a gull-wing shape which is one of flat packaging shapes. As illustrated in FIG. 3, each of the outer lead portions 5B formed into the gull-wing shape is constructed having a root part 5B1 which protrudes out of the sealing body 10, an intermediate part 5B2 which bends downwards (onto the side of the rear surface of the front and rear surfaces of the sealing body 10) from the root part 5B1, and a mounting part 5B3 which extends in the same direction as the extending direction of the root part 5B1 from the intermediate part 5B2. The mounting part 5B3 is used as a terminal for external connection in the case where the semiconductor device is mounted onto a mounting substrate with a solder. Such outer lead portions 5B are arrayed at a pitch of, for example, 0.4 [mm] in this embodiment.

In the outer lead portion 5B of each connection lead 5, the lead width W1 of the root part 5B1 is broader than the lead width W3 of the mounting part 5B3. Further, the lead width W1 of the root part 5B1 is set at a dimension being equal to or greater than the lead thickness T of the connection lead 5, whereas the lead width W3 of the mounting part 5B3 is set at a dimension being less than the lead thickness T. In this embodiment, the lead width W1 of the root part 5B1 is 0.15 [mm], the lead width W3 of the mounting part 5B3 is 0.14 [mm], and the lead thickness T of the connection lead 5 is 0.15 [mm]. In this manner, the root parts 5B1 of the outer lead portions 5B are formed at the lead width W1 being equal to or greater than the lead thickness T, whereby the mechanical strength of the root parts in the connection lead arraying direction becomes higher than in case of forming the root parts 5B1 of the outer lead portions 5B at a lead width less than the lead thickness T. Besides, the mounting parts 5B3 of the outer lead portions 5B are formed at the lead width W3 being less than the lead thickness T, whereby the interval between the respectively adjacent connection leads at the mounting parts 5B3 becomes broader than in case of forming the mounting parts 5B3 of the outer lead portions 5B at a lead width equal to or greater than the lead thickness T.

The outer lead portion 5B of each connection lead 5 includes a tie bar separating part 5B4 which has a lead width W2 broader than the lead width W1 of the root part 5B1, and which is provided at the intermediate part 5B2. In this embodiment, the entire intermediate part 5B2 except the tie bar separating part 5B4 is formed at the same lead width as that of the mounting part 5B3.

Figure 4:
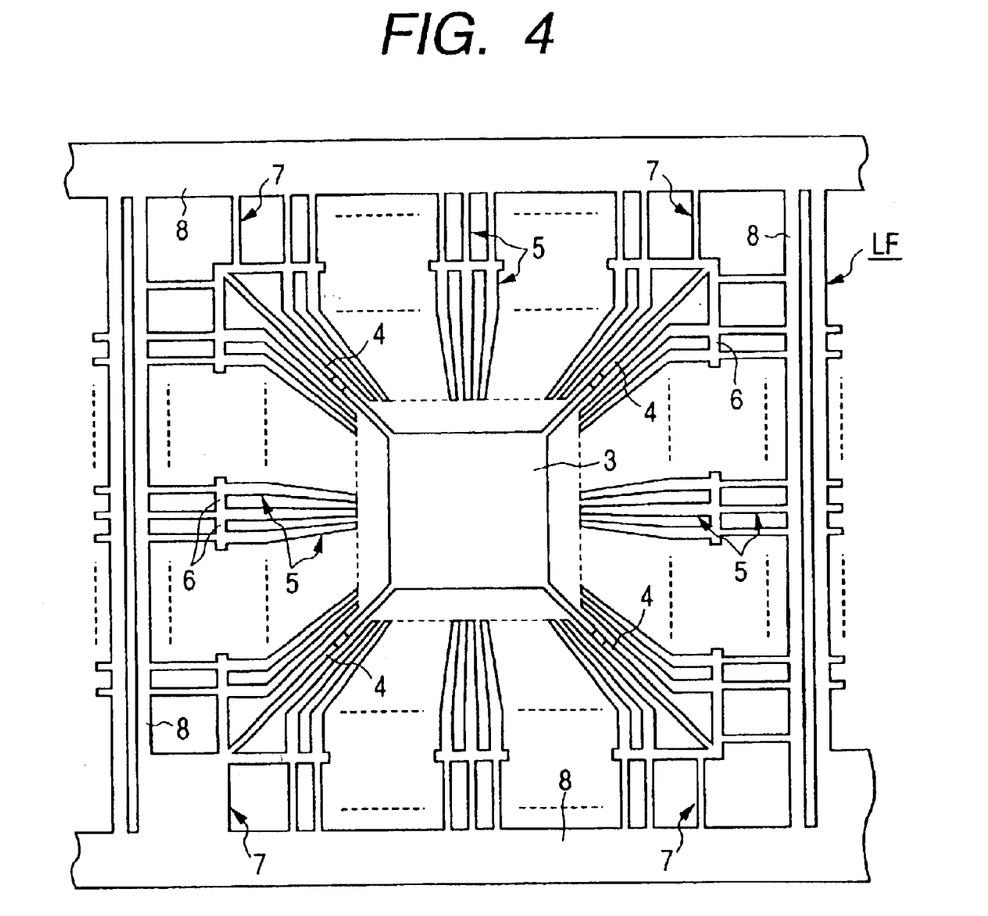
FIG. 4 is a schematic plan view of a lead frame which is used in an assembling process for the semiconductor device.
Figure 5:
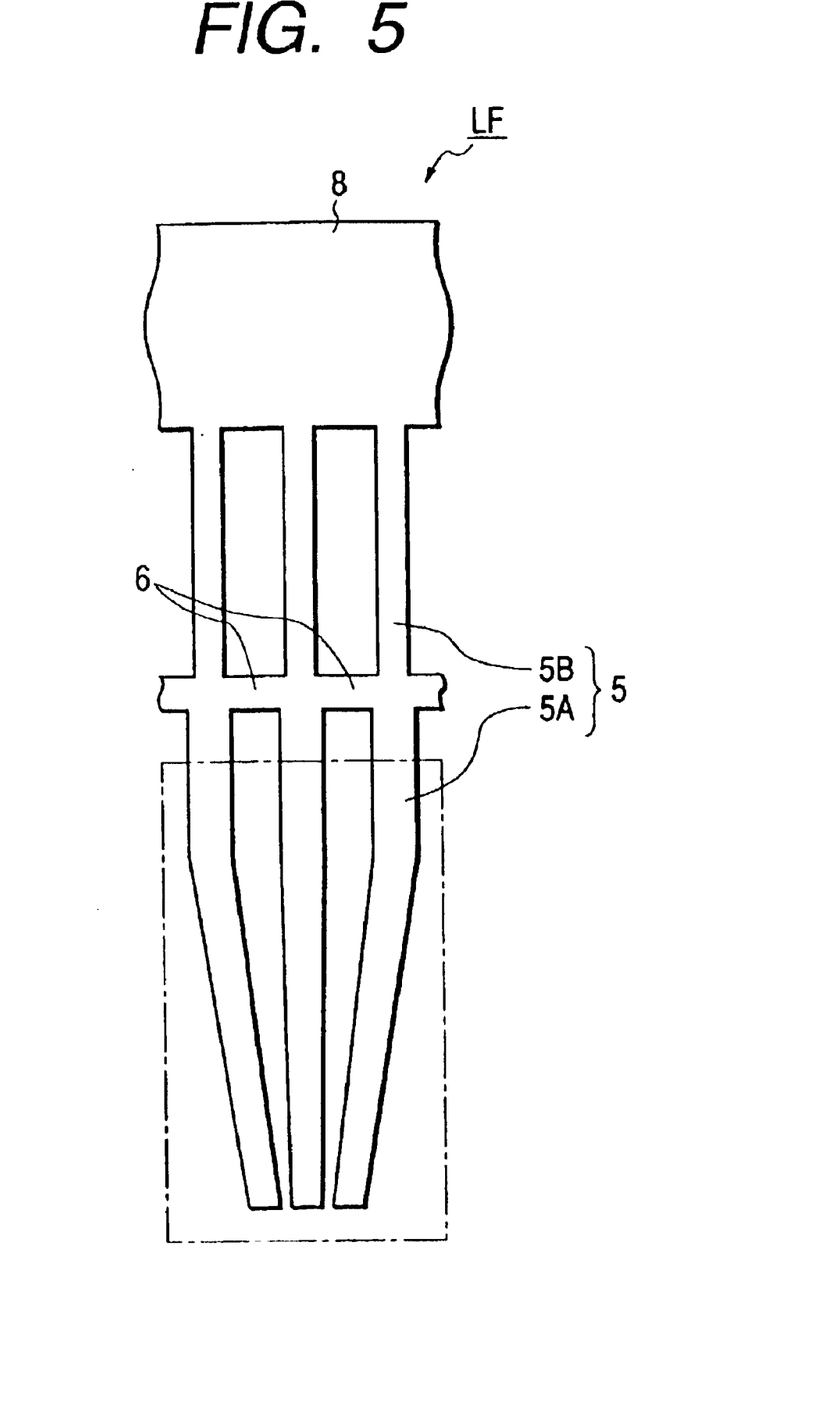
FIG. 5 is an enlarged schematic plan view of essential portions shown in FIG. 4.

Next, the schematic construction of a lead frame which is used in an assembling process (manufacturing process) for the semiconductor device will be described with reference to FIGS. 4 and 5. FIG. 4 is a schematic plan view of the lead frame, while FIG. 5 is an enlarged schematic plan view of essential portions shown in FIG. 4.

As illustrated in FIG. 4, the lead frame LF is constructed having a die pad 3, four supporting leads 4, a plurality of leads for connections 5, lead support portions 7 etc., within a lead arrangement region whose perimeter is defined by a frame member 8 and which has a square shape when viewed in plan. The die pad 3 lies at the central part of the lead arrangement region, and is formed in a square planar shape. Each of the four supporting leads 4 is integral with the corresponding corner of the die pad 3 on one end side thereof, and it is integral with the lead supporting portion 7 provided at the corresponding corner of the lead arrangement region, on the other end side thereof. The lead support portions 7 are integral with the frame member 8. Each of the four supporting leads 4 is subjected to a bending work for locating the die pad 3 at a level lower than that of the connection leads 5.

The plurality of connection leads 5 are divided into four lead groups, which are disposed at the respective latera of the frame member 8 so as to surround the die pad 3. The connection leads 5 of each lead group are arrayed along the corresponding latus of the frame member 8. Besides, each of the connection leads 5 of each lead group lies near the die pad 3 on one end side thereof and is integral with the frame member 8 on the other end side thereof. As illustrated in FIG. 5, the connection leads 5 of each lead group are constructed of a single lead member having inner lead portions (portions surrounded with a dot-and-dash line in the figure) 5A which are to be arranged inside a sealing body, and outer lead portions 5B which are to be arranged outside the sealing body. Also, the connection leads 5 of each lead group are tied with the respectively adjacent connection leads 5 through tie bars 6 which are provided for the purpose of preventing a resin from flowing out when the sealing body is formed. The tie bars 6 are arranged near the root parts of the outer lead portions 5B.

In the outer lead portion 5B of each connection lead 5, an inward part lying on the side of the inner lead portion 5A with respect to the tie bar 6 is formed at a lead width being equal to or greater than a lead thickness, and an outward part lying on the side of the frame member 8 with respect to the tie bar 6 is formed at a lead width being less than the lead thickness. In the lead frame LF of this embodiment, the lead width of the inward part of the outer lead portion 5B is set at 0.15 [mm], the lead width of the outward part of the outer lead portion 5B is set at 0.14 [mm], and the lead thickness is set at 0.15 [mm].

By way of example, the lead frame LF is formed in such a way that a flat material made of an alloy of iron (Fe)—nickel (Ni) system (whose Ni content is, for example, 42 or 50 [%]) is subjected to an etching process or a press work, thereby to form a predetermined lead pattern, whereupon the bending work for locating the die pad 3 below the connection leads 5 is carried out for each of the four supporting leads 4.

Figure 6:
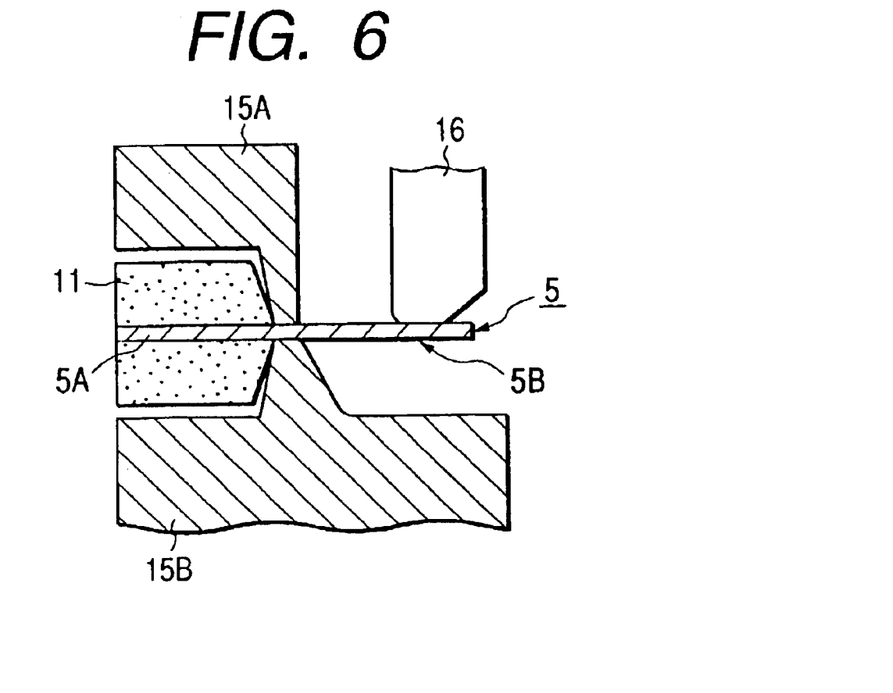
FIG. 6 is a schematic sectional view for explaining the lead forming step of the semiconductor device.
Figure 7:
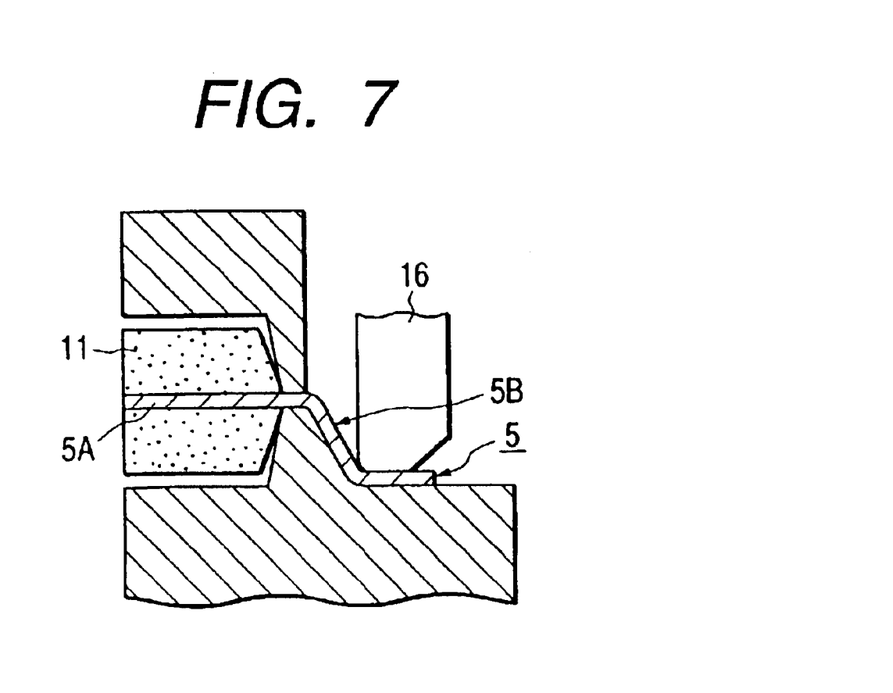
FIG. 7 is a schematic sectional view for explaining the lead forming step of the semiconductor device.

Next, the assembling process of the semiconductor device will be described with reference to FIGS. 4, 6 and 7. FIGS. 6 and 7 are schematic sectional views for explaining a lead forming step.

First, the lead frame LF shown in FIG. 4 is prepared. Thereafter, a semiconductor chip 1 is mounted through an adhesive onto the chip mounting surface of the die pad 3 which is supported by the frame member 8 of the lead frame LF through the supporting leads 4 as well as the lead supporting portions 7. Thereafter, electrodes 2 formed on the circuit forming surface 1A of the semiconductor chip 1 and the inner lead portions 5A of the connection leads 5 supported by the frame member 8 of the lead frame LF are electrically connected by pieces of conductive wire 9. Thereafter, the semiconductor chip 1, the die pad 3, the supporting leads 4, the inner lead portions 5A of the connection leads 5, and the wire pieces 9 are encapsulated with a sealing body 10 on the basis of transfer molding technology. Thereafter, the tie bars 6 tying the adjacent connection leads 5 are cut away. Thereafter, the outer lead portions 5B of the connection leads 5 are subjected to a solder plating treatment by electroplating.

Subsequently, the outer lead portions 5B of the connection leads 5 are formed into a gull-wing shape having root parts 5B1 each of which protrudes out of the sealing body 10, intermediate parts 5B2 each of which bends downwards (onto the side of the rear surface of the front and rear surfaces of the sealing body 10) from the root part 5B1, and mounting parts 5B3 each of which extends in the same direction as the extending direction of the root part 5B1 from the intermediate part 5B2. More specifically, the outer lead portions 5B of the connection leads 5 are shaped into the gull-wing shape in such a way that, as illustrated in FIG. 6, the root part of each of the outer lead portions 5B is clamped by the protuberances of a lead keeper member 15A and a bending bed 15B, while a bending punch 16 is brought into touch with the distal end part of the outer lead portion 5B, and that, as illustrated in FIG. 7, the bending punch 16 is thereafter moved aslant toward the protuberance of the bending bed 15B. Here at the lead forming step of the outer lead portion 5B, the defective lead forming of the outer lead portion 5B into the state in which it bends in the direction of arraying the connection leads 5 can be suppressed for the reason that, since the root part 5B1 of the outer lead portion 5B is formed at the lead width W1 equal to or greater than the lead thickness T, the mechanical strength of the root part 5B1 in the connection lead arraying direction becomes higher than in case of forming the root part 5B1 of the outer lead portion 5B at a lead width less than the lead thickness T.

Subsequently, the distal end parts of the mounting parts 5B3 are cut off in order to properly locate the distal ends of the mounting parts 5B3 of the outer lead portions 5B. Thereafter, the supporting leads 4 are cut away from the lead supporting portions 7 of the lead frame LF. In this way, the semiconductor device 1 shown in FIGS. 1 through 3 is substantially completed.

Figure 8:
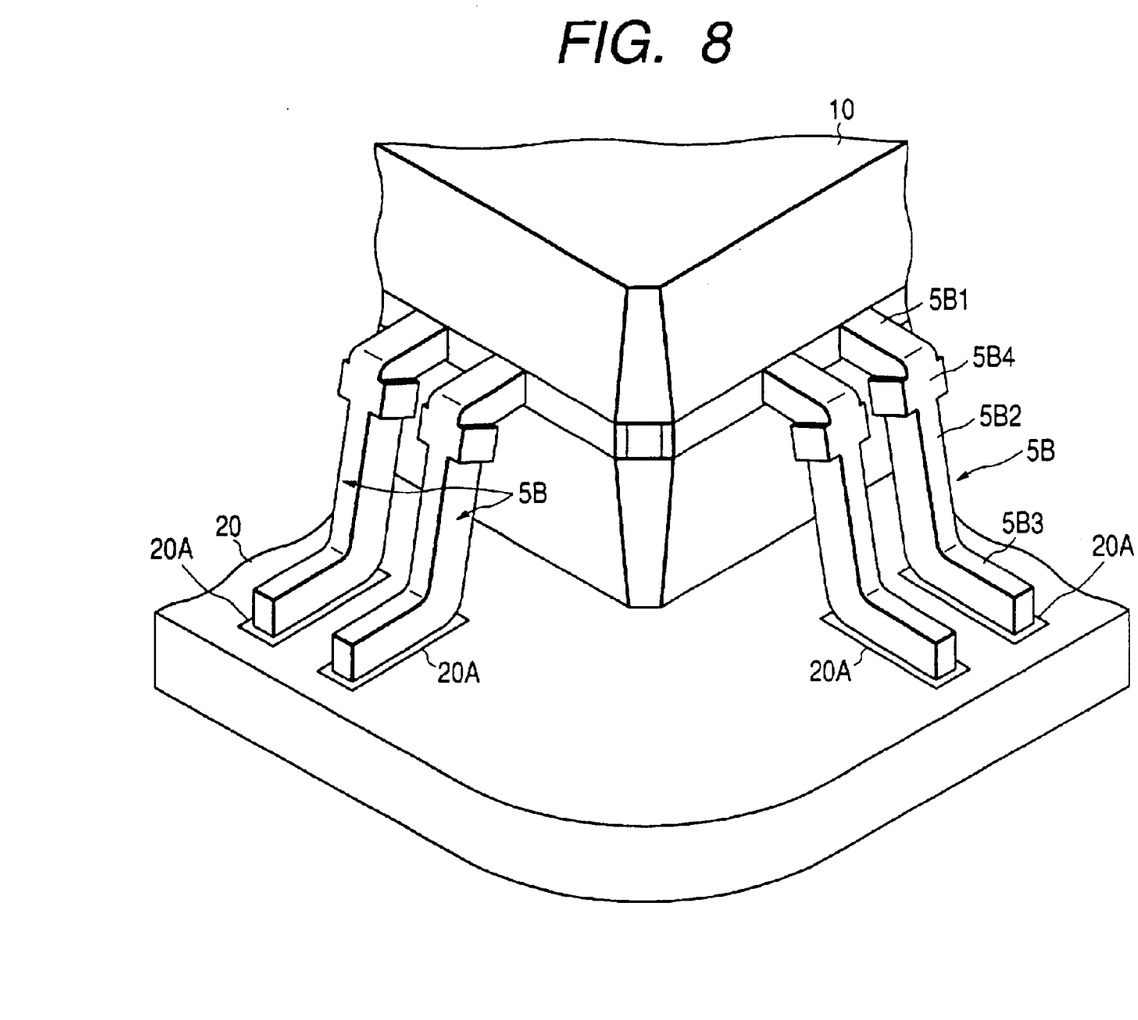
FIG. 8 is a schematic perspective view of the essential portions of the semiconductor device in a state where this semiconductor device has been mounted on a mounting substrate.

The semiconductor device thus constructed is mounted on a mounting substrate 20 as illustrated in FIG. 8 (a schematic perspective view of the essential portions of the semiconductor device in a state where this semiconductor device has been mounted on the mounting substrate). The mounting of the semiconductor device is done in such a way that solder paste layers are formed on the electrodes 20A of the mounting substrate 20 by, for example, screen printing, that the semiconductor device is thereafter arranged on the mounting substrate 20 with the mounting parts 5B3 of the respective outer lead portions 5B located on the electrodes 20A through the corresponding solder paste layers, that the resultant mounting substrate 20 is thereafter conveyed into, for example, an infrared reflow furnace, and that the solder paste layers are thereafter molten, followed by hardening. Here at the mounting step of the semiconductor device, solder bridges which appear across the mounting parts 5B3 of the outer lead portions 5B can be suppressed to suppress the defective mounting of the short-circuit between the connection leads 5 for the reason that, since the mounting part 5B3 of the outer lead portion 5B is formed at the lead width W3 less than the lead thickness T, the interval between the respectively adjacent connection leads 5 at the mounting parts 5B3 becomes broader than in case of forming the mounting part of the outer lead portion 5B at a lead width equal to or greater than the lead thickness T.

In this manner, the following effects are attained in accordance with this embodiment:

Since the root parts 5B1 of outer lead portions 5B are formed at a lead width W1 being equal to or greater than a lead thickness T, the mechanical strength of the root parts 5B1 in the direction of arraying connection leads 5 becomes higher than in case of forming the root parts 5B1 of the outer lead portions 5B at a lead width less than the lead thickness T. It is therefore possible to suppress the defective lead forming that, in a lead forming operation for the outer lead portions 5B, these outer lead portions 5B are formed into the state in which they bend in the connection lead arraying direction.

Besides, since the mounting parts 5B3 of the outer lead portions 5B are formed at a lead width W3 being less than the lead thickness T, the interval between the respectively adjacent connection leads at the mounting parts 5B3 becomes broader than in case of forming the mounting parts 5B3 of the outer lead portions 5B at a lead width equal to or greater than the lead thickness T. It is therefore possible to suppress solder bridges which appear across the mounting parts 5B3 of the adjacent leads 5 in soldering and mounting a semiconductor device onto a mounting substrate 20, and to suppress the defective mounting that the adjacent connection leads 5 short-circuit.

By the way, this embodiment has been described concerning the example wherein each of the outer lead portions 5B is molded into the configuration in which the tie bar separating part 5B4 is provided at the intermediate part 5B2. However, each of the outer lead portions 5B may well be molded into a configuration in which a tie bar separating part 5B4 is provided at the root part 5B1.

Figure 9:
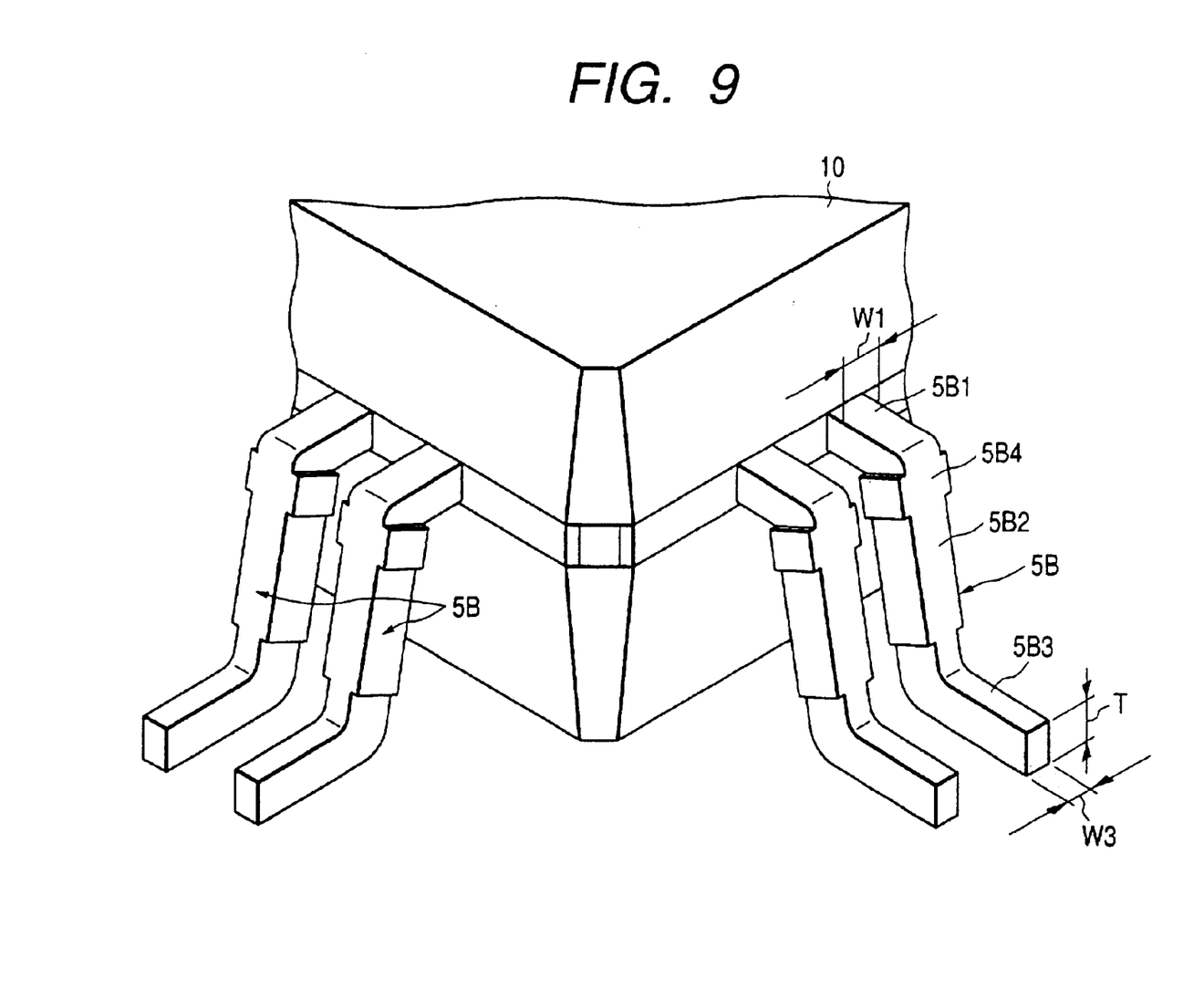
FIG. 9 is a schematic perspective view of the essential portions of a semiconductor device showing a modification to the embodiment of the present invention.

Besides, although the example employing the lead frame made of the alloy material of Fe—Ni system has been described in this embodiment, it is also allowed to employ a lead frame made of an alloy material of copper (Cu) system being superior in electric conductivity to the alloy material of Fe—Ni system. Since, in this case, the alloy material of Cu system is softer than the alloy material of Fe—Ni system, the lead width of the root parts 5B1 of the outer lead portions 5B should desirably be set somewhat broader than in the case of the embodiment described before. Also, as illustrated in FIG. 9 (a schematic perspective view of essential portions), the lead width of the entire intermediate part 5B2 except the tie bar separating part 5B4 and a part on the side of the mounting part 5B3 should desirably be set at the same lead width as that of the root part 5B1.

While the invention made by the inventors has been concretely described above in conjunction with the embodiments, it is a matter of course that the present invention is not restricted to the foregoing embodiments, but that it is variously alterable within a scope not departing from the purport thereof.

By way of example, the present invention is applicable to semiconductor devices of flat packaging type in which the outer lead portions of connection leads are set at a narrow pitch.

What is claimed is:

1. A method of manufacturing a semiconductor device comprising the steps of:

providing a semiconductor chip which is formed with semiconductor elements and a plurality of electrodes on its principal surface;

providing a lead frame having a frame member, a die pad and a plurality of leads, the die pad and the leads being supported by the frame member;

mounting the semiconductor chip through an adhesive onto the die pad;

electrically connecting the plurality of electrodes with the plurality of leads by a plurality of conductive wires, respectively;

encapsulating the semiconductor chip, the die pad, inner portions of the plurality of leads and the plurality or wires with a sealing body; and forming outer portions of the plurality of leads, which are protruding outwardly from the sealing body, into a gull-wing shape each having a first part which extends in a direction away from the sealing body, a second part which bends downwards from the first part, a third part which extend from the second part in a direction away from the sealing body, a first bent portion formed between the first part and the second part and a second bent portion formed between the second part and the third part, wherein each of the first bent portions has a width equal to or greater than a thickness of the lead, wherein each of the third parts has a width less than a thickness of the lead, wherein the plurality of leads are arrayed in a width direction of the leads, and wherein the lead frame comprises copper.

2. A method of manufacturing a semiconductor device according to claim 1, wherein the lead frame is comprised of alloy or copper.

3. A method of manufacturing a semiconductor device according to claim 2, wherein in the step of forming outer portions of the plurality of leads into a gull-wing shape, further bending the plurality of leads in a thickness direction of the leads to form the first bent portion with clamping of the first part of the leads.

4. A method of manufacturing a semiconductor device according to claim 2, wherein in the step of forming outer portions of the plurality of leads into a gull-wing shape, bending the plurality of leads in a thickness direction of the leads to form the first bend portion by bending punch with clamping of the first part of the leads.

5. A method of manufacturing a semiconductor device according to claim 4, further comprising a step of cutting off distal end parts of the third parts of the plurality of leads after the step of forming outer portions of the plurality of leads into a gull-wing shape.

6. A method of manufacturing a semiconductor device according to claim 4, wherein the semiconductor chip has a logic circuit.

7. A method of manufacturing a semiconductor device according to claim 5, wherein the semiconductor chip has a logic circuit.

8. A method of manufacturing a semiconductor device according to claim 7, wherein the second bent portion has a width being to or less than a thickness of the leads.

9. A method of manufacturing a semiconductor device according to claim 8, wherein the first bent portion is wider than the third part.

* * * * *